(12) United States Patent
van Rumpt (10) Patent No.: US 6,922,550 B1
(45) Date of Patent: Jul. 26, 2005

(54) COMMUNICATION DEVICE WITH EFFICIENT EXCITATION OF A RESONANT CIRCUIT

(75) Inventor: Herman Wouter van Rumpt, 's-Hertogenbosch (NL)

(73) Assignee: ItoM, Breda (NL)

( * ) Notice: Subject to any disclaimer, the term of this patent is extended or adjusted under 35 U.S.C. 154(b) by 0 days.

(21) Appl. No.: 09/720,230

(22) PCT Filed: Apr. 11, 2000

(86) PCT No.: PCT/EP00/03203

§ 371 (c)(1),
(2), (4) Date: Dec. 19, 2000

(87) PCT Pub. No.: WO00/64044

PCT Pub. Date: Oct. 26, 2000

(30) Foreign Application Priority Data

Apr. 19, 1999 (EP) ............................................. 99201195

(51) Int. Cl.⁷ .................................................. H04B 1/02
(52) U.S. Cl. .................. 455/102; 455/127.1; 455/127.3
(58) Field of Search ........................... 455/127.1, 127.3, 455/102, 106, 91, 501

(56) References Cited

U.S. PATENT DOCUMENTS

| | | | | |
|---|---|---|---|---|
| 4,717,884 A | * | 1/1988 | Mitzlaff | ...................... 330/251 |
| 5,515,036 A | * | 5/1996 | Waraksa et al. | .......... 455/127.1 |
| 6,122,492 A | * | 9/2000 | Sears | ....................... 455/127.1 |
| 6,147,605 A | * | 11/2000 | Vega et al. | ............... 340/572.7 |
| 6,166,643 A | * | 12/2000 | Janning et al. | ................ 455/91 |
| 6,362,738 B1 | * | 3/2002 | Vega | ....................... 340/572.1 |

* cited by examiner

Primary Examiner—Edward F. Urban
Assistant Examiner—Lana Le
(74) Attorney, Agent, or Firm—Robert M. McDermott, Esq.

(57) ABSTRACT

A reduction of the overall power loss in a resonance circuit is achieved by having excitation occur within excitation periods (Tex) of resonation periods (Tfre), during which the resonance circuit is in a free running resonance mode, the excitation periods being smaller than the resonation periods, to define an excitation duty cycle (Tex/Tcar) relative to the period of a carrier signal (Tcar) of less than 0.5. Preferably the resonance frequency (fres) of the resonance circuit is higher than the carrier frequency (fcar) of the modulated high frequency carrier signal over a resonance frequency detuning rate (dfres), defined by the frequency deviation of the resonance frequency from the carrier frequency relative to the carrier frequency (fres/fcar-1), substantially at most corresponding to half the excitation duty cycle.

43 Claims, 7 Drawing Sheets

COMMUNICATION DEVICE WITH EFFICIENT EXCITATION OF A RESONANT CIRCUIT

The invention relates to a communication device including a power amplifier for amplifying a modulated high frequency carrier input signal comprising a resonance circuit and an excitation circuit for a signal excitation in the resonance circuit phase and/or frequency coupled with the modulated high frequency carrier signal.

A communication device including a power amplifier of the above type is known from the article "A 1.9 GHz 1W CMOS Class E Power Amplifier for Wireless Communications" by King-Chun Tsai and Paul R. Gray, Department of Electrical Engineering and Computer Sciences, University of California, Berkeley, Calif., U.S.A., published in Proceedings of the 24$^{th}$ European Solid-State Conference, The Hague, The Netherlands, 22–24 Sep. 1998.

The resonance circuit of the known power amplifier comprises a parallel LC resonance circuit AC serially connected between a supply voltage terminal and mass, through a controllable switching. The switching element is to switch the full supply voltage across the resonance circuit alternately during half period cycles of the carrier frequency, synchronised with the phase and/or frequency modulation of said high frequency carrier input signal. This results in a likewise synchronised signal excitation in the resonance circuit. The common node between the capacitor and the inductor provides an output of the resonance circuit, and therewith an output of the power amplifier, supplying the information embedded in the modulation with a power amplification to a bandpass filter. The bandpass filter is to select the fundamental component of the voltage occurring across the resonance circuit and to suppress harmonic distortion occurring in the output signal of the resonance circuit.

The resonance circuit is designed such with regard to the switching operation, that in steady state, ideally the resonance circuit signal, i.e. the voltage across the capacitor, crosses zero level, immediately before the switch is closed. According to the teachings of said article, the switch would dissipate no power then, because it is closed when the voltage across the switch is zero, hereinafter also referred to as soft switching concept. The signal losses in the switch, hereinafter also referred to as switching or excitation losses, would therewith be eliminated and all of the DC supply power would therewith be delivered to the output of the LC load network. The measures mentioned to arrive at this ideal situation of zero excitation losses are aimed at an accurate half cycle periodic operation of the switch, which would a.o. result in the capacitor being fully discharged at the moment the switch is closed, and are aimed at steep switching transients. The circuitry needed for such precise switching operation are rather complex.

However, communication devices have to keep up with ever increasing market demands. Power amplifiers are one of the key circuits basically determining the overall performance of such devices. For important applications within the field of telecommunication, the requirements put to power amplifiers in terms of power added efficiency and cost effectiveness already increased beyond the limits attainable with power amplifiers based on the above known principle.

Therefore, the invention has for its first object to improve the performance of communication devices by providing a power amplifier based on a new principle having an efficiency, substantially higher than achievable with the above known power amplifier.

A second object of the invention is to provide a versatile power amplifier applicable in communication devices complying with a broad range of telecommunication standards.

A third object of the invention is to provide a communication device to great extent being suitable for a cost effective implementation in integrated form.

According to the invention a communication device including a power amplifier for amplifying a modulated high frequency carrier input signal comprising a resonance circuit and an excitation circuit for a signal excitation in the resonance circuit phase and/or frequency coupled with the modulated high frequency carrier signal, is therefore characterized by said excitation occurring within excitation periods (Tex) in a periodic alternation with resonation periods (Tfre), during which the resonance circuit is in a free running resonance mode, the excitation periods being smaller than the resonation periods to define an excitation duty cycle (Tex/Fcar) relative to the period of the carrier signal (Tcar), hereinafter also indicated as excitation duty cycle, of less than 0.5.

Unlike the teachings and aims of the above cited reference, the invention is targeted at a reduction of the overall signal power loss in the total transmitter end stage signal processing including the amplification, selection and transmission of the RF signal. The invention is based on the recognition that extending the free running period of the resonance circuit (Tfre) of the power amplifier beyond a half cycle period results in a reduction of the total harmonic signal distortion, hereinafter also referred to as THD losses, at the output the resonance circuit without necessarily increasing significantly the above excitation losses. The power needed for an effective signal excitation in the resonance circuit can therefore be reduced as well, without affecting the amplifier output power. This results in an increase in the overall efficiency of the power amplifier.

The invention therewith cuts across the notion that decreasing the duty cycle of a resonance circuit input signal below 0.5 of the signal period will lead to signal power loss due to spectral power spread inherent to any decrease in signal duty cycle.

The measure according to the invention provides a fundamental breakthrough beyond the bottom limit of signal power loss of the known power amplifier, allowing to substantially improve the performance of communication devices.

According to a further recognition of the invention, said measure does not prevent to apply the abovementioned soft switching concept to eliminate excitation losses completely. Starting from a certain excitation duty cycle, a complete elimination of switching losses can be achieved by a certain value for the resonance frequency (fres) of the resonance circuit. On the other hand, by chosing the resonance frequency (fres) of the resonance circuit at the fres at the carrier frequency (fcar) of the modulated high frequency carrier signal THD losses are eliminated. In practise said certain value for the resonance frequency (fres) deviates from the carrier frequency (fcar). Expressing said resonance frequency (fres) in a socalled resonance frequency detuning rate (dfres), defining the frequency deviation by which the resonance frequency (fres) is higher than the carrier frequency (fcar) of the modulated high frequency carrier signal relative to said carrier frequency (dfres=fres/fcar=1), an advantangeous trade off between excitation losses and THD losses according to the invention to come to a minimisation of the overall power loss of the power amplifier as a whole, is met in a preferred embodiment of a communication device according to the invention, which is characterized by said resonance frequency detuning rate (dfres) corresponding substantially at most to half the excitation duty cycle.

This measure allows minor excitation losses to occur, which on the one hand are sufficiently small not to deteriorate the overall reduction in signal power loss of the power amplifier due to the reduction in THD losses, and which on the other hand are sufficiently large to allow for a cost effective implementation, using much less complex circuitry than needed in the cited known power amplifier.

In particular for an excitation cycle between an order of magnitude of 0.1 and 0.5, the latter embodiment of a communication device according to the invention is characterized by said resonance frequency detuning rate (dfres) being in the order of magnitude of the half square value of said excitation duty cycle.

Apart from the excitation duty cycle and the resonance frequency detuning rate, also the quality factor (Q) of the resonance circuit is a parameter in the trade off between excitation and THD losses. In a preferred embodiment of a communication device according to the invention using the quality factor as an additional parameter, the excitation duty cycle is being defined to decrease with increasing quality factor (Q) of the resonance circuit and vice versa, in particular for an excitation duty cycle between an order of magnitude of 0.1 and 0.5.

The above measures are approximations of the following, more precise definitions for the abovementioned excitation duty cycle (Tex/Tcar) and resonance frequency detuning rate (dfres), leading to an optimal trade off between excitation losses and THD losses, being substantially equal to:

$$dfres[Q] = 0.5 \left[ \frac{Sqrt\left[1 - \left(1 - \frac{1}{Q}\right)^4\right]}{2 \, Pi\left(1 - \frac{1}{Q}\right)^2} + \frac{3 + \frac{2 \, ArcSin\left[\left(1 - \frac{1}{Q}\right)^2\right]}{Pi}}{4} - 1 \right]$$

and $$(Tex/Tcar)[Q] = $$

$$\frac{Sqrt\left[1 - \left(1 - \frac{1}{Q}\right)^4\right]}{2 \, Pi\left(1 - \frac{1}{Q}\right)^2 \left( \frac{Sqrt\left[1 - \left(1 - \frac{1}{Q}\right)^4\right]}{2 \, Pi\left(1 - \frac{1}{Q}\right)^2} + \frac{3 + \frac{2 \, ArcSin\left[\left(1 - \frac{1}{Q}\right)^2\right]}{Pi}}{4} \right)}$$

The trade off between excitation and THD losses according to the invention causes a discontinuity to occur in the slope of the output signal of the resonance circuit during the resonation periods at the start of the excitation periods, reflecting the switching loss.

Said discontinuity may be caused by a DC level shift in the excitation signal.

In a preferred embodiment, the excitation circuit of the communication device is provided with a controllable switching device serially arranged with the resonance circuit between first and second terminals of a voltage supply source and having a control terminal coupled to the input of the power amplifier for periodically supplying an excitation voltage signal to the resonance circuit, phase and/or frequency coupled with the modulated carrier signal circuit. In the excitation of the resonance circuit according to the invention, there is no necessity to minimize the switching signal transient time, i.e. to use an excitation signal with smooth signal transients. This allows to simplify the implementation of the communication device, in which said controllable switching device comprises a switch resistance serially arranged with the resonance circuit between the first and second terminals of said voltage supply source and being varied from a maximum resistance value to a minimum resistance value and vice versa to smoothen transients of said excitation voltage signal increasing above a threshold voltage within the excitation periods. In such communication device the controllable switching device may well comprise a MOS transistor having its drain source path serially coupled to the resonance circuit being controlled to vary the switch resistance stepwise.

$$(Tex/Tcar)[Q] = $$

$$\frac{Sqrt\left[1 - \left(1 - \frac{1}{Q}\right)^4\right]}{2 \, Pi\left(1 - \frac{1}{Q}\right)^2 \left( \frac{Sqrt\left[1 - \left(1 - \frac{1}{Q}\right)^4\right]}{2 \, Pi\left(1 - \frac{1}{Q}\right)^2} + \frac{3 + \frac{2 \, ArcSin\left[\left(1 - \frac{1}{Q}\right)^2\right]}{Pi}}{4} \right)}$$

The trade off between excitation and THD losses according to the invention causes a discontinuity to occur in the slope of the output signal of the resonance circuit during the resonation periods at the start of the excitation periods, reflecting the switching loss.

Said discontinuity may be caused by a DC level shift in the excitation signal.

In a preferred embodiment, the excitation circuit of the communication device is provided with a controllable switching device serially arranged with the resonance circuit between first and second terminals of a voltage supply source and having a control terminal coupled to the input of the power amplifier for periodically supplying an excitation voltage signal to the resonance circuit, phase and/or frequency coupled with the modulated carrier signal circuit. In the excitation of the resonance circuit according to the invention, there is no necessity to minimize the switching signal transient time, i.e. to use an excitation signal with smooth signal transients. This allows to simplify the implementation of the communication device, in which said controllable switching device comprise a switch resistance serially arranged with the resonance circuit between the first and second terminals of said voltage supply source and being varied from a maximum resistance value to a minimum resistance value and vice versa to smoothen transients of said excitation voltage signal increasing above a threshold voltage within the excitation periods. In such communication device the controllable switching device may well comprise a MOS transistor having its drain source path serially coupled to the resonance circuit being controlled to vary the switch resistance stepwise.

In the communication device according to the invention the excitation of the resonance circuit not only tracks modulation dependent phase and/or frequency deviations of the modulated high frequency carrier input signal, but also allows to amplify modulation dependent envelope amplitude variations of said input signal, if any. The extra degree of freedom provided herewith makes it possible to comply with various different telecommunication standards, including those using constant envelope modulated high frequency carrier signals (such as e.g. GMS) and those using modulated envelope high frequency carrier signals (such as e.g. CDMA). When using an excitation circuit with a controllable switching device as indicated above, such communication device preferably comprises amplitude modulation means for modulating the amplitude of the supply voltage between the first and second terminals of the voltage supply source with modulation signal dependent envelope amplitude variations of the modulated high frequency carrier signal.

In allowing to use smooth signal transients, the invention enables to use bipolar transistor circuitry for the excitation of the resonance circuit. Another preferred embodiment of a communication device according to the invention is therefore characterized in that the excitation circuit comprises a charge pump supplying an excitation current signal, phase and/or frequency coupled with the modulated carrier signal circuit having smooth transients between a minimum and a maximum current level and increasing above a threshold current level within the excitation periods. In this embodiment, this threshold current level is chosen such that the part of the excitation current signal in excess of the threshold current level is determining and/or dominating the signal in the resonance circuit.

Such a communication device is preferably characterized in that an output stage of the charge pump comprises a bipolar transistor, the collector emitter path thereof being serially coupled to the resonance circuit between first and second terminals of a supply voltage source.

When using an excitation circuit with a charge pump as indicated above, a preferred embodiment of a communication device complying with telecommunication standards using modulated envelope high frequency carrier signals comprises amplitude modulation means for modulating the excitation signal as well as a supply voltage coupled to the resonance circuit with modulation signal dependent envelope amplitude variations of the modulated high frequency carrier signal.

Another preferred embodiment of a communication device is characterized in that the resonance circuit input means comprise a pulse generator controlling the excitation circuit to modulate the excitation signal in its phase and/or frequency and/or envelope amplitude in correspondence with the modulated high frequency carrier signal.

In telecommunication standards using constant envelope modulated high frequency carrier signals the envelope amplitude of the excitation signal is kept constant.

Another preferred embodiment of a communication device according to the invention is characterized by said antenna means having narrow bandwidth and being part of the resonance circuit.

This measure allows to combine main part of the resonance circuit functionality with the functionality of the antenna means, therewith providing an extensive integration of the resonance circuit with the antenna means and reducing the number of elements needed.

Preferably the antenna impedance is coupled to a tap of the inductor of said parallel LC circuit, which removes the need for an antenna impedance transformer.

The above and other object features and advantages of the present invention will be discussed more in detail hereinafter with reference to the disclosure of preferred embodiments and in particular with reference to the appended Figures, that show.

Figure 1:
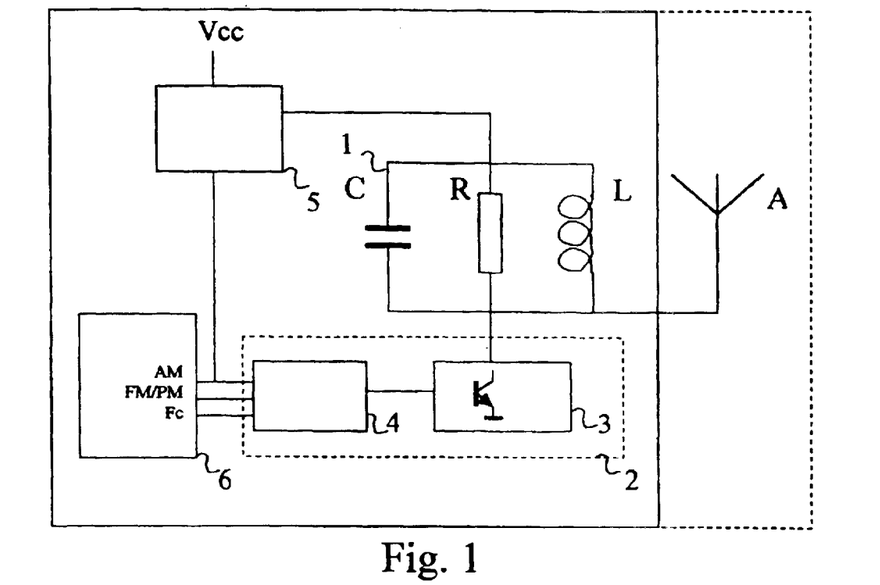
FIG. 1 a blockdiagram of a communication device including a first embodiment of a power amplifier according to the invention.

FIG. 1 shows a blockdiagram of a communication device according to the invention, which is compliant to telecommunication standards using modulated envelope high frequency carrier signals (such as e.g. CDMA), including a power amplifier (1–5), preceded by a transmitter pre-stage unit 6 and followed by antenna means A. The transmitter pre-stage unit 6 is provided with an output supplying a high frequency carrier signal at a terminal Fc, a baseband modulation signal for modulating said high frequency carrier signal in phase and/or frequency at a terminal FM/PM, and a baseband modulation signal for modulating the envelope amplitude of said high frequency carrier signal at a terminal AM. With regard to the transmitter pre-stage unit 6 reference is made to existing prior art CDMA portable communication devices. Detailed knowledge of the transmitter pre-stage unit 6 is not needed to properly understand the invention, reason for which the unit 6 will not be further described.

Figure 8:
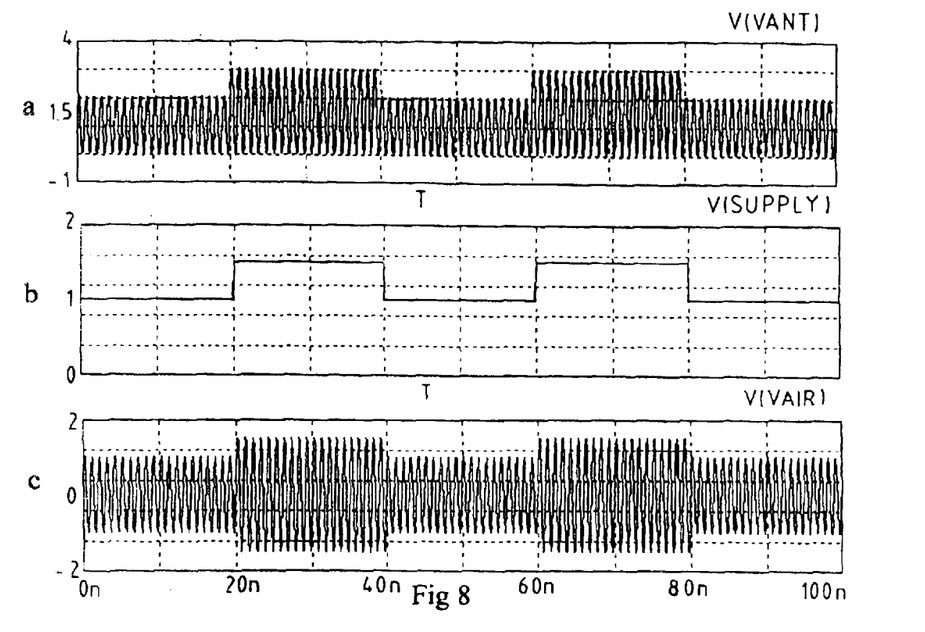
FIGS. 8a–c signal plots illustrating the functioning of the power amplifier according to the invention when being used to for amplifying an envelope amplitude modulated high frequency carrier signal.

The power amplifier (1–5) comprises a resonance circuit 1 arranged between resonance circuit input means 2 and the antenna means A, the resonance circuit input means 2 comprising an excitation circuit 3 coupled between a pulse generator 4 and the resonance circuit 1 for supplying an excitation signal thereto. The baseband modulation signals at the terminals PM/FM and AM, hereinafter referred to as PM/FM and AM baseband modulation signals respectively, and the high frequency carrier signal at the terminal Fc of the transmitter pre-stage unit 6 are supplied to the pulse generator 4, which derives therefrom control signal pulses for the excitation circuit 3. These pulses do not refer to a specific signal form, as will be explained hereinafter in more detail with reference to FIG. 8 and may be rectangular, sinusoidal, Gaussian or otherwise. The control signal pulses are generated at each period of the high frequency carrier signal phase and/or frequency modulated with the PM/FM baseband modulation signal with a duty cycle less than 50%. In addition the pulse generator 4 also modulates the envelope amplitude of these control pulses with the AM baseband modulation signal. The circuitry needed to come to an excitation signal as defined hereabove, i.e. tracking the modulated high frequency carrier signal in its phase and/or frequency and/or amplitude and having a duty cycle less than 50%, can as such be designed and implemented by anyone skilled in the art to arrive at. In this connection, reference is made to Philips' pulse generator type PM 5786 B. The functionality of the pulse generator 4 may well be combined with the functionality of excitation circuit 3 in one single device.

The excitation circuit 3 comprises a charge pump with an output stage having a bipolar transistor, the collector emitter path thereof being serially coupled to the resonance circuit 1 between first and second terminals of a supply voltage source Vcc.

The resonance circuit 1 comprises a parallel RLC circuit directly coupled to the antenna means A. The resistor R represents mainly the radiation resistance of the antenna means A. The resonance frequency of the circuit 1 is chosen to correspond substantially to the carrier frequency (fcar) of the modulated high frequency carrier signal. The quality factor Q of the resonance circuit is preferably chosen to be greater than 1.

Furthermore, if the antenna means A are dimensioned to have a narrow bandwidth, then such narrow bandwidth antenna means can provide the functionality of the parallel RLC circuit to a great part. This removes the need to use a completely equipped RLC circuit in the resonance circuit 1, allowing to integrate the antenna means A as part of the power amplifier (1–5).

The pulse generator 4 controls the excitation circuit 3 to generate an excitation signal following the control pulses in their phase and/or frequency and their envelope amplitude modulation, and having continuous transients between a minimum and a maximum current level, the excitation current signal exceeding 50% of the maximum current level during a periodic time interval smaller than 50% of the repetition time of the input signal. The excitation signal excitates the resonance circuit 1, therewith bringing this circuit in a resonance mode in accordance with the invention.

In addition thereto the supply voltage Vcc is amplitude modulated with AM baseband modulation signal through an amplitude modulator 5, which is coupled to the terminal AM of the transmitter pre-stage unit 6. With regard to this amplitude modulator 5, reference is made to Philips' IC LM 78xx or equivalent ICs.

The functioning of the power amplifier with regard to AM modulations will be explained with reference to FIGS. 8a–c.

Figure 2:
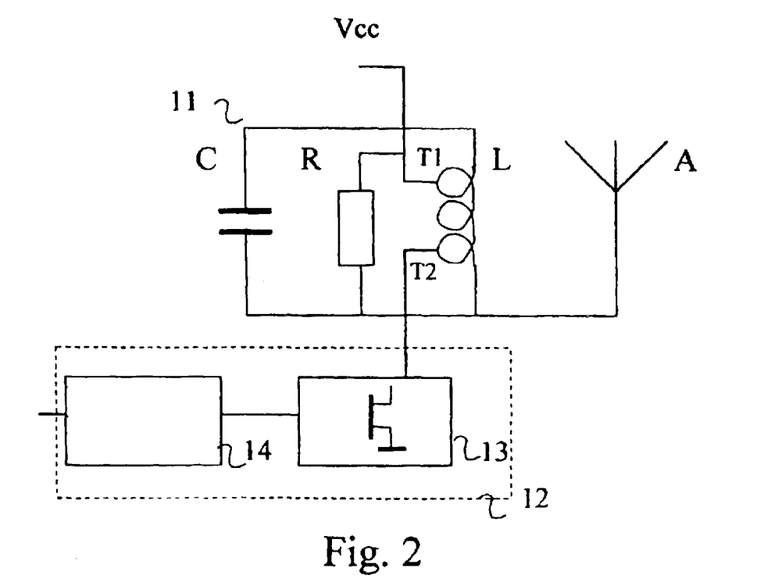
FIG. 2 a blockdiagram of a second embodiment of a power amplifier according to the invention.

FIG. 2 shows a blockdiagram of a second embodiment of a power amplifier for use in a communication device according to the invention in which elements corresponding to those of FIG. 1 have the same references. The excitation circuit 3 now comprises a switching device using a MOS transistor having its drain source path serially arranged with the resonance circuit 1 between first and second terminals of a supply voltage source, respectively connected to mass and a supply voltage Vcc. For AC signals both first and second terminals may be considered to be massconnected.

In the resonance circuit 1 the capacitor C is parallel connected to the inductor L, but unlike the resonance circuit of FIG. 1, the inductor L is now provided with first and second taps, T1 respectively T2. The first tap T1 is coupled to the resistor R and the second supply voltage terminal, the second tap T2 is coupled to the output of the excitation circuit 3, therewith therewith providing proper antenna impedance matching without using an extra impedance transformer.

Figure 3A:
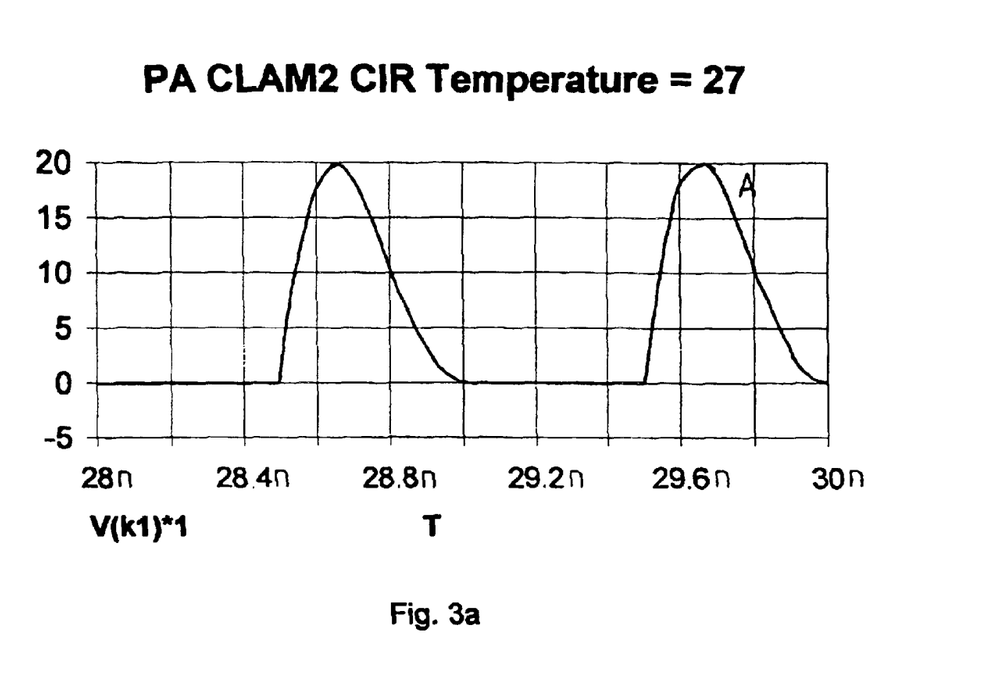
FIGS. 3a,b signal plots showing the effect on an excitation signal having a 50% duty cycle on THD losses (curve C) when used in the power amplifier of FIG. 1, in which the excitation circuit is provided with a MOS transistor output stage, the quality factor of the resonance circuit Q being 1.5 and the resonance frequency detuning rate being 60%.
Figure 3B:
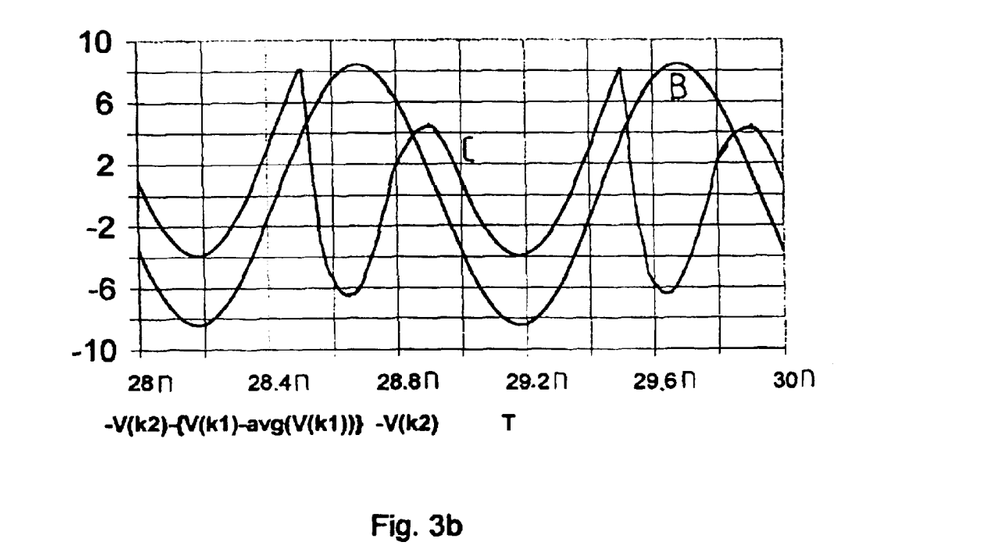

FIGS. 3a–c show signal plots illustrating the effect of an excitation signal (curve A) having a 50% duty cycle on THD losses (curve C) when used in the power amplifier of FIG. 1, in which the excitation circuit is provided with a MOS transistor output stage, the quality factor of the resonance circuit Q being 1.5 and the resonance frequency detuning rate (dfres) being 60%. The switching losses are practically zero. The THD losses being derived from the difference between the first order harmonic frequency of the resonance circuit uotput signal indicated by curve B and the curve A excitation signal are considerable and may be used as a reference for the THD losses occurring in the cited prior art power amplifier.

Figure 4A:
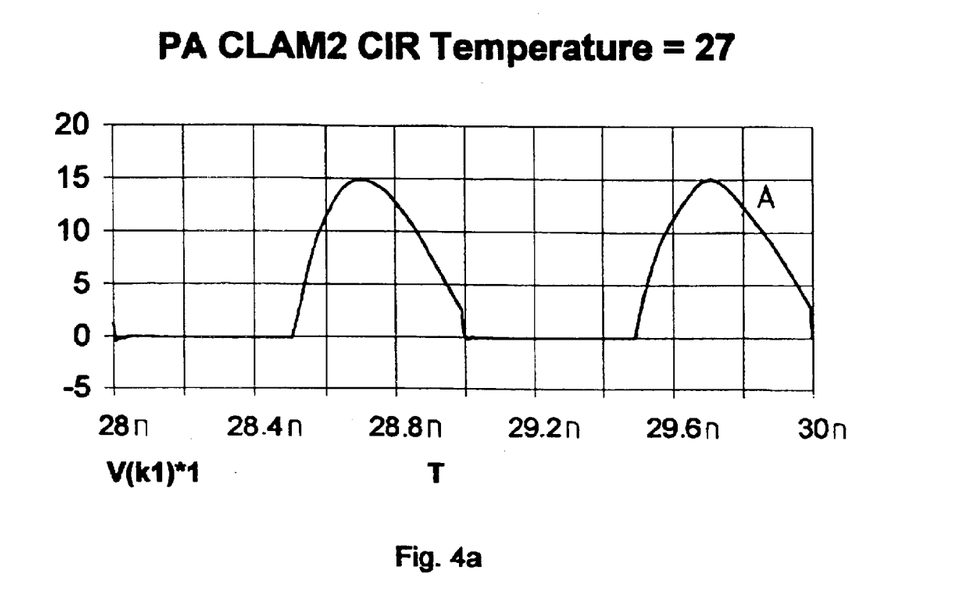
FIGS. 4a,b signal plots showing the effect of an excitation signal having a 50% duty cycle on THD losses (curve C) and switching or excitation losses when used in the power amplifier of FIG. 1, in which the excitation circuit is provided with a MOS transistor output stage, the quality factor of the resonance circuit Q being 1.5 and the resonance frequency detuning rate being 27%.
Figure 4B:
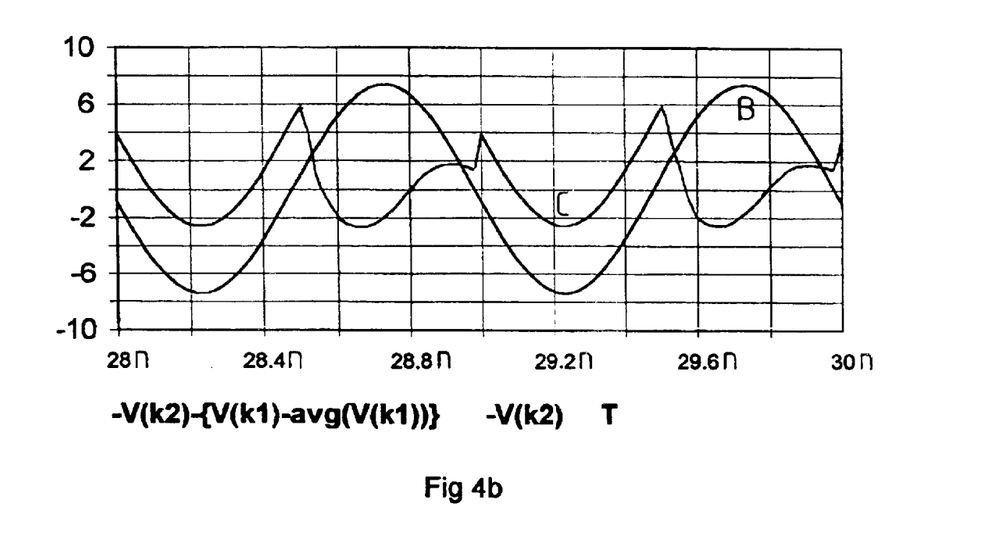

FIGS. 4a–c show signal plots illustrating the effect of an excitation signal having a 50% duty cycle (curve A) on THD losses (curve C) and switching or excitation losses when used in the power amplifier of FIG. 1, in which the excitation circuit is provided with a MOS transistor output stage, the quality factor of the resonance circuit Q being 1.5 and the resonance frequency detuning rate being 27%. Now switching losses are appearing, reflected in a discontinuity at point D of curve A, however, the reduction in THD losses in much greater than these switching losses, as is shown in curve C. The net reduction effect of detuning of the resonance frequency of the resonance circuit on the overall power loss is demonstrated herein to improve the efficiency of the above cited power amplifier, i.e. also with an excitation duty cycle of 0.5.

Figure 5A:
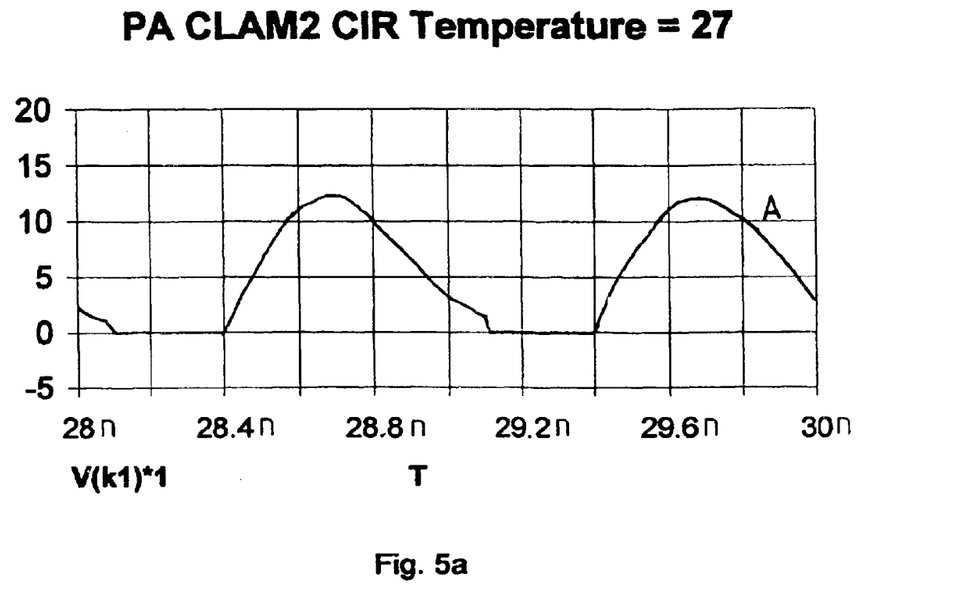
FIGS. 5a,b signal plots showing the effect of an excitation signal having a 30% duty cycle on THD losses (curve C) and switching or excitation losses when used in the power amplifier of FIG. 1, in which the excitation circuit is provided with a MOS transistor output stage, the quality factor of the resonance circuit Q being 3 and the resonance frequency detuning rate being 10%.
Figure 5B:
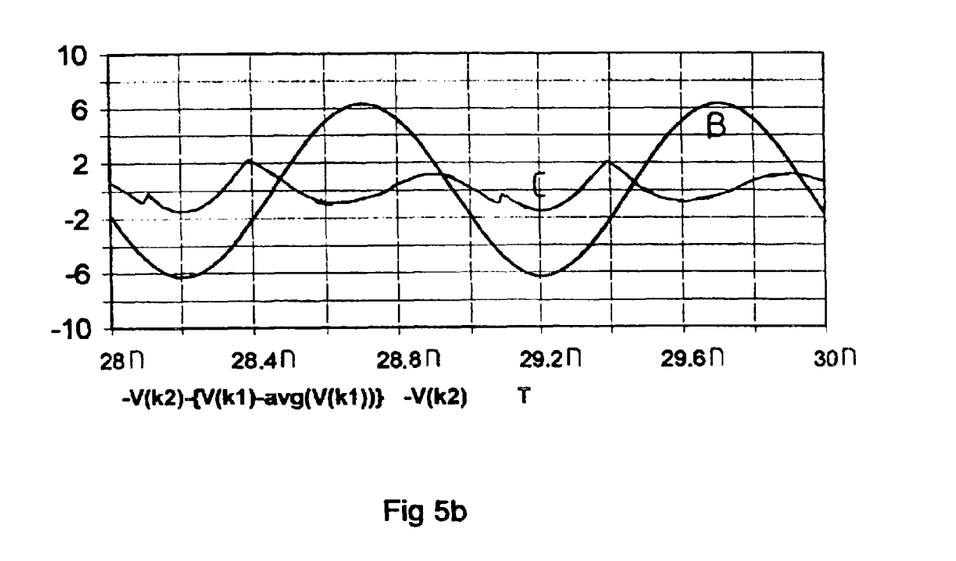

FIGS. 5a–c show signal plots illustrating the effect of an excitation signal (curve A) having a 30% duty cycle on THD losses (curve C) and switching or excitation losses when used in the power amplifier of FIG. 1, in which the excitation circuit is provided with a MOS transistor output stage, the quality factor of the resonance circuit Q being 3 and the resonance frequency detuning rate being 10%. Here, an optimal trade off between switching and THD losses is obtained, resulting in a minimised overall power loss of the power amplifier.

Figure 6:
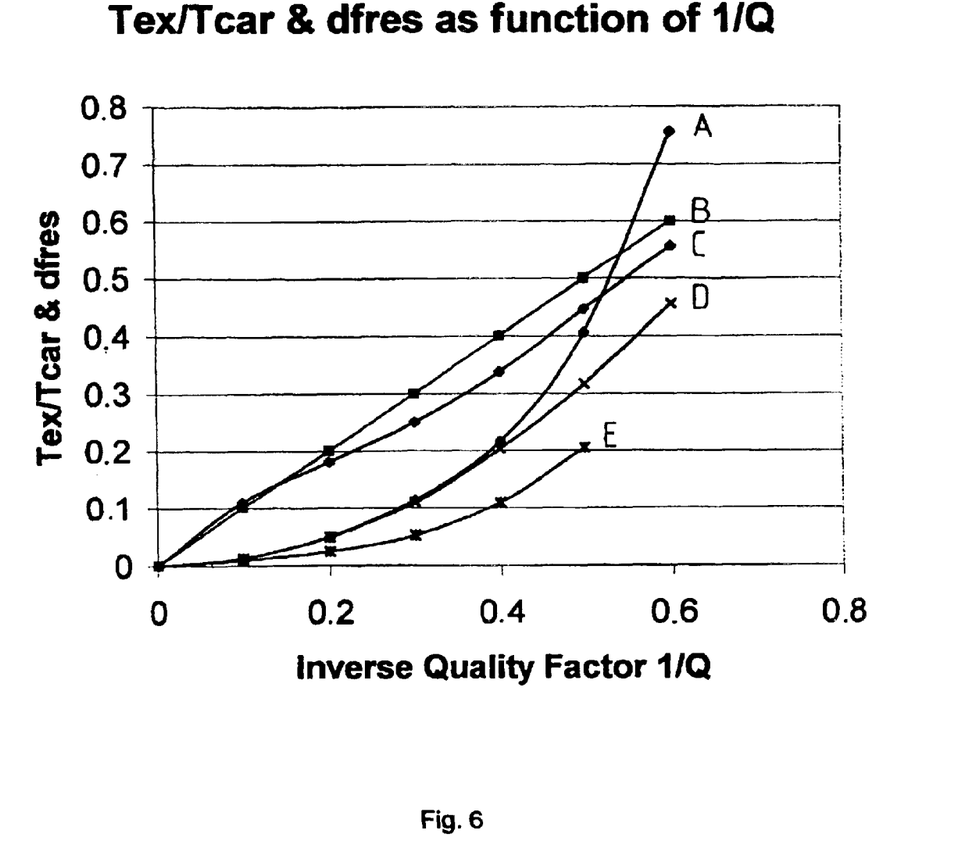
FIG. 6 signal plots showing as a function of the inverse value of the quality factor of the resonance circuit which value of the excitation duty cycle and the detuning frequency results in a substantial elimination of respectively signal losses in the excitation circuit, THD losses and overall signal losses in the power amplifier as a whole.
Figure 7:
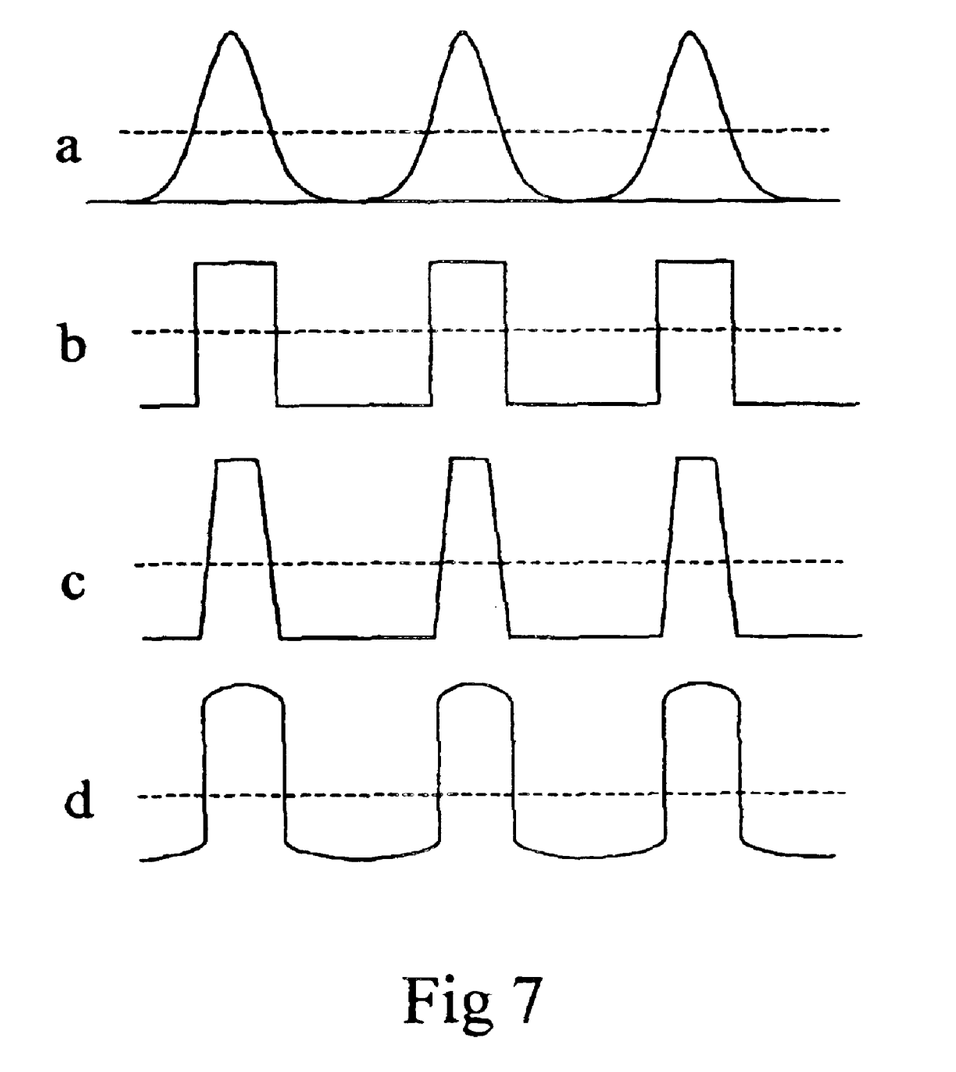
FIGS. 7a–d various excitation signal forms usable in a communication device according to the invention.

FIG. 6 shows the interrelationship between the three parameters: excitation duty cycle (Tex/Tcar), the resonance frequency detuning rate (dfres) and quality factor (Q) of the resonance circuit in signal plots indicating as a function of the inverse value of the quality factor (1/Q) of the resonance circuit respectively in curve A which value of the resonance frequency detuning rate (dfres), in curve B which value of the excitation duty cycle when approximated by (1/Q), in curve C which value of the excitation duty cycle and in curve D which value of the resonance frequency detuning rate (dfres) when approximated by $(4/Pi)(1/Q)^2$ results in a substantial elimination of respectively signal losses in the excitation circuit. The curves A and C are based respectively on the following formulas:

$$dfres[Q] = \frac{Sqrt\left[1 - \left(1 - \frac{1}{Q}\right)^4\right]}{2\, Pi\left(1 - \frac{1}{Q}\right)^2} + \frac{3 + \frac{2\, ArcSin\left[\left(1 - \frac{1}{Q}\right)^2\right]}{Pi}}{4} - 1$$

$$(Tex/Tcar)[Q] =$$

$$\frac{Sqrt\left[1 - \left(1 - \frac{1}{Q}\right)^4\right]}{2\, Pi\left(1 - \frac{1}{Q}\right)^2 \left(\frac{Sqrt\left[1 - \left(1 - \frac{1}{Q}\right)^4\right]}{2\, Pi\left(1 - \frac{1}{Q}\right)^2} + \frac{3 + \frac{2\, ArcSin\left[\left(1 - \frac{1}{Q}\right)^2\right]}{Pi}}{4}\right)}$$

THD losses are minimised for zero value of the excitation duty cycle (Tex/Tcar) and the resonance frequency detuning rate (fres/fcar−1), which correspond to the horizontal X coordinate.

Curve E shows a trade off between switching and THD losses according to the invention, which is based on taking 50% of the value for the resonance frequency detuning rate necessary to minimise switching losses. This value results in an overall reduction of power loss in the power amplifier as a whole and is most likely to lead to the most optimal trade off. However, in practise, it may well be that a value somewhat deviating from the abovementioned value of 50% for the resonance frequency detuning rate (dfres) will give a somewhat better trade off in terms of minimum overall power loss.

The signal plot clearly shows that substantial elimination of signal losses in the excitation circuit does not depend on the duty cycle. Even for duty cycles greater than 0.5 relative to the carrier signal period these excitation losses can be eliminated.

A commercially interesting optimization area is defined by values of the duty cycle between approximately 0.1 and 0.5 relative to the carrier signal period. The following table is to demonstrate the effect of the optimal trade off between switching or excitation losses and THD losses according to the invention on the reduction in the overall signal losses in quantitive form.

| Duty cycle (Tex/Tcar) | Q | (Tex/Tcar) = 0.5 dfres chosen to minimise switching losses | | Optimal trade off between THD losses & switching losses | | Dfres = 0 (fres = fcar) Minimum THD losses | |
|---|---|---|---|---|---|---|---|
| | | Dfres | efficiency | Dfres | Efficiency | Dfres | Efficiency |
| 0.5 | 1.75 | 0.6 | 69% | 0.3 | 84% | 0 | 69% |
| 0.4 | 2.13 | 0.34 | 84% | 0.17 | 91% | 0 | 81% |
| 0.3 | 2.8 | 0.16 | 92% | 0.08 | 95% | 0 | 88% |
| 0.2 | 4.35 | 0.07 | 95% | 0.035 | 96% | 0 | 91% |

It will be clear, that the invention is not limited to a 50% value for the resonance frequency detuning rate to come to an effective trade off between excitation loss and THD loss leading to a overall reduction of the power loss of the power amplifier as a whole. Values for the resonance frequency detuning rate resulting in such effective trade off may vary within an order of magnitude of 50%. Furthermore, dependent on the specific application of the power amplifier, it may well be that excitation losses are to be suppressed to larger extend than THD losses, or vice versa. The resonance frequency detuning rate can be chosen to meet the requirements of said specific application.

The curves also show that an increasing the quality factor of the resonance circuit (Q) allows to decrease the resonance frequency detuning rate dfres as well as the excitation duty cycle (Tres/Tcar) to arrive at an optimal trade off in terms of minimised overall power loss. Dependent on this Q factor the excitation duty cycle may be chosen below the abovementioned value of the order to magnitude of 0.1, and the resonance frequency detuning rate dfres may be chosen close to the carrier frequency (fcar) of the high frequency carrier signal.

FIGS. 7a–d show four various excitation signal forms a–d usable in a communication device according to the invention. These signals all have a duty cycle less than 50% and continuous transients between a minimum and a maximum level, the signal exceeding 50% of the maximum current level during a periodic time interval smaller than 50% of its repetition time.

FIGS. 8a–c show signal plots illustrating the functioning of the power amplifier according to the invention when being used for amplifying an envelope amplitude modulated high frequency carrier signal with a digital AM baseband modulation signal as depicted in FIG. 8b.

FIG. 8a shows the result of AM modulation of an otherwise unmodulated (i.e. without PM and/or FM modulations) high frequency carrier signal obtained with the communication device of FIG. 1. In order to allow the resonance signal amplitude to vary with the AM modulation signal both excitation signal and supply voltage have to be amplitude modulated. The minimum voltage level occurring at the resonance circuit remains constant as shown in FIG. 8a, whereas the transmitted antenna signal is varying symmetrically around zero level as is shown in FIG. 8c.

When using the power amplifier of FIG. 2, the excitation doesn't need to be varied and variation of the supply voltage with the AM baseband modulation signal suffices. This results again in a signals as shown in FIGS. 8a and 8c.

The possibility to arrive at a high frequency carrier transmitter signal being PM and/or FM modulated as well as AM modulated allows to use the communication devices according to the invention in telecommunication standard, such as e.g. CDMA. However, by keeping the envelope of the a high frequency carrier transmitter signal constant these communication devices may also be used in telecommunication standard such as e.g. GSM.

In a prototype power amplifier as shown in FIG. 1 using a charge pump in the excitation circuit 3, the following relationships between the quality of the resonance circuit 1 and the duty cycle of the excitation signal used, were measured:

| | Q = | | | | |
|---|---|---|---|---|---|
| duty cycle = | 2 | 4 | 6 | 8 | 10 |
| 50% | 68 | 67 | 66 | 65 | 64 |
| 45% | 74 | 74 | 73 | 72 | 71 |
| 32% | 85 | 88 | 88 | 88 | 86 |
| 25% | 83 | 91 | 92 | 92 | 90 |
| 14% | 70 | 85 | 91 | 93 | 93 |
| 4% | 63 | 76 | 83 | 87 | 88 |

Significant improvements in efficiency are obtained within the area defined by a quality factor greater than an order of magnitude of 2 and a duty cycle of the excitation signal less than an order of magnitude of 40%.

In the above the invention is explained with a voltage and current like excitation of the resonance circuit, bounding the area of characteristics of circuitry, which can be used to materialize the invention. It is clear that the invention may well be applied with any implementation of the excitation circuit 3 having a mixed current/voltage output characteristic.

Furthermore the signal forms usable for an excitation in accordance with the invention are not limited to the ones shown in FIGS. 7a–d and include any form within the definition given in the claims.

The invention removes the necessity to use a bandpassfilter, however, such use is not precluded.

What is claimed is:

1. A communication device including a power amplifier for amplifying a modulated high frequency carrier input signal comprising a resonance circuit and an excitation circuit for a signal excitation in the resonance circuit phase and/or frequency coupled with the modulated high frequency carrier signal, characterized by said excitation occurring within excitation periods (Tex) in a periodic alternation with resonation periods (Tfre), during which the resonance circuit is in a free running resonance mode, the excitation periods being smaller than the resonation periods to define an excitation duty cycle (Tex/Tcar) relative to the period of the carrier signal (Tcar) of less than 0.5, and the resonance circuit having a resonance frequency (fres) higher than the carrier frequency (fcar) of the modulated high frequency carrier signal over a resonance frequency detuning rate (dfres), defined by the frequency deviation of said resonance frequency from said carrier frequency relative to the carrier frequency (fres/fcar−1), substantially at most corresponding to half the excitation duty cycle.

2. A communication device according to claim 1, characterized by said resonance frequency detuning rate (dfres) being in the order of magnitude of the half square value of said excitation duty cycle (Tex/Tcar) for an excitation duty cycle above an order of magnitude of 0.1.

3. A communication device according to claim 2, characterized by the excitation duty cycle (Tex/Tcar) being defined to decrease with increasing quality factor (Q) of the resonance circuit and vice versa for an excitation duty cycle (Tex/Tcar) above an order of magnitude of 0.1.

4. A communication device according to claim 3, characterized by a discontinuity in the slope of the signal occurring in the resonance circuit during the resonation periods at the start of the excitation periods.

5. A communication device according to claim 1, characterized by the excitation duty cycle (Tex/Tcar) being defined to decrease with increasing quality factor (Q) of the resonance circuit and vice versa for an excitation duty cycle (Tex/Tcar) above an order of magnitude of 0.1.

6. A communication device according to claim 1, characterized by a discontinuity in the slope of the signal occurring in the resonance circuit during the resonation periods at the start of the excitation periods.

7. A communication device according to claim 6, characterized by a DC level shift causing said discontinuity to occur.

8. A communication device according to claim 1, characterized in that the excitation circuit comprises a controllable switching device serially arranged with the resonance circuit between first and second terminals of a voltage supply source and having a control terminal coupled to the input of the power amplifier for periodically supplying an excitation voltage signal to the resonance circuit, phase and/or frequency coupled with the modulated carrier signal circuit.

9. A communication device according to claim 8, characterized in that the controllable switching device comprises a switch resistance serially arranged with the resonance circuit between the first and second terminals of said voltage supply source and being varied from a maximum resistance value to a minimum resistance value and vice versa to smoothen transients of said excitation voltage signal increasing above a threshold voltage within the excitation periods.

10. A communication device according to claim 9, characterized in that the controllable switching device comprises a MOS transistor having its drain source path serially coupled to the resonance circuit being controlled to vary the switch resistance stepwise.

11. A communication device according to claim 8, characterized by amplitude modulation means for modulating the amplitude of the supply voltage between the first and second terminals of the voltage supply source with modulation signal dependent envelope amplitude variations of the modulated high frequency carrier signal.

12. A communication device according to claim 1, further including a pulse generator controlling the excitation circuit to modulate the excitation signal in its phase and/or frequency and/or envelope amplitude in correspondence with the modulated high frequency carrier signal.

13. A communication device according to claim 1, characterized by the resonance circuit having a resonance filter quality factor greater than 1.

14. A communication device according to claim 1, characterized by a balanced implementation of the excitation circuit and the resonance circuit.

15. A communication device according to claim 1, characterized in that the resonance circuit comprises a parallel RLC network, an inductor and resistor thereof being part of an antenna device.

16. A communication device according to claim 1, characterized in that the resonance circuit comprises a parallel RLC circuit comprising an inductor provided with a tapped coupling to the antenna impedance.

17. A communication device according to claim 16, characterized in that the inductor is provided with a further tap, coupled to the excitation circuit.

18. A communication device according to claim 1 further including an antenna device having narrow bandwidth.

19. High frequency power amplifier for use in a communication device according to claim 1, characterized by a resonance circuit part provided with antenna coupling means for completing the resonance circuit part to form said resonance circuit by coupling antenna means thereto.

20. A communication device according to claim 5, characterized by a discontinuity in the slope of the signal occurring in the resonance circuit during the resonation periods at the start of the excitation periods.

21. A communication device including a power amplifier for amplifying a modulated high frequency carrier input signal comprising a resonance circuit and an excitation for a signal excitation in the resonance circuit phase and/or frequency coupled with the modulated high frequency carrier signal, characterized by said excitation occurring within excitation periods (Tex) in a periodic alternation with resonation periods (Tfre), during which the resonance circuit is in a free running resonance mode, the excitation periods being smaller than the resonation periods to define an excitation duty cycle (Tex/Tcar) relative to the period of the carrier signal (Tcar) of less than 0.5, characterized by an excitation duty cycle (Tex/Tcar) and a resonance frequency detuning rate (dfres=fres/fcar−1) being substantially defined by:

$$\left(\frac{Tex}{Tcar}\right)[Q] = \frac{\sqrt{1-\left(1-\frac{1}{Q}\right)^4}}{2\pi\left(1-\frac{1}{Q}\right)^2 = \left(\frac{\sqrt{1-\left(1-\frac{1}{Q}\right)^4}}{2\pi\left(1-\frac{1}{Q}\right)^2} + \frac{3+2\arcsin\left(1-\frac{1}{Q}\right)^2/\pi}{4}\right)}.$$

22. A communication device including a power amplifier for amplifying a modulated high frequency carrier input signal comprising a resonance circuit and an excitation for a signal excitation in the resonance circuit phase and/or frequency coupled with the modulated high frequency carrier signal, characterized by said excitation occurring within excitation periods (Tex) in a periodic alternation with resonation periods (Tfre), during which the resonance circuit is in a free running resonance mode, the excitation periods being smaller than the resonation periods to define an excitation duty cycle (Tex/Tcar) relative to the period of the carrier signal (Tcar) of less than 0.5, characterised by a resonance frequency detuning rate (dres=fres/fcar−1) being substantially defined by:

$$dfres[Q] = 0.5 \left( \frac{\sqrt{1-\left(1-\frac{1}{Q}\right)^4}}{2\pi\left(1-\frac{1}{Q}\right)^2} + \frac{3 + 2\arcsin\left(1-\frac{1}{Q}\right)^2 / \pi}{4} - 1 \right).$$

23. A communication device according to claim 6, characterized in that the excitation circuit comprises a controllable switching device serially arranged with the resonance circuit between first and second terminals of a voltage supply source and having a control terminal coupled to the input of the power amplifier for periodically supplying an excitation voltage signal to the resonance circuit, phase and/or frequency coupled with the modulated carrier signal circuit.

24. A communication device according to claim 23, characterized in that the controllable switching device comprises a switch resistance serially arranged with the resonance circuit between the first and second terminals of said voltage supply source and being varied from a maximum resistance value to a minimum resistance value and vice versa to smoothen transients of said excitation voltage signal increasing above a threshold voltage within the excitation periods.

25. A communication device according to claim 23, characterized in that the controllable switching device comprises a MOS transistor having its drain source path serially coupled to the resonance circuit being controlled to vary the switch resistance stepwise.

26. A communication device according to claim 23, characterized by amplitude modulation means for modulating the amplitude of the supply voltage between the first and second terminals of the voltage supply source with modulation signal dependent envelope amplitude variations of the modulated high frequency carrier signal.

27. A communication device including a power amplifier for amplifying a modulated high frequency carrier input signal comprising a resonance circuit and an excitation circuit for a signal excitation in the resonance circuit phase and/or frequency coupled with the modulated high frequency carrier signal, characterized by said excitation occurring within excitation periods (Tex) in a periodic alternation with resonation periods (Tfre), during which the resonance circuit is in a free running resonance mode, the excitation periods being smaller than the resonation periods to define an excitation duty cycle (Tex/Tcar) relative to the period of the carrier signal (Tcar) of less than 0.5, characterized in that the excitation circuit comprises a charge pump supplying an excitation current signal, phase and/or frequency coupled with the modulated carrier signal having smooth transients between a minimum and a maximum current level and increasing above a threshold current level within the excitation periods.

28. A communication device according to claim 27, characterized in that an output stage of the charge pump comprises a bipolar transistor, the collector emitter path thereof being serially coupled to the resonance circuit between first and second terminals of a supply voltage source.

29. A communication device according to claim 27, characterized by amplitude modulation means for modulating the excitation signal as well as a supply voltage coupled to the resonance circuit with modulation signal dependent envelope amplitude variations of the modulated high frequency carrier signal.

30. A communication device according to claim 27, characterized by the excitation duty cycle (Tex/Tcar) being defined to decrease with increasing quality factor (Q) of the resonance circuit and vice versa for an excitation duty cycle (Tex/Tcar) above an order of magnitude of 0.1.

31. A communication device according to claim 27, characterized by a discontinuity in the slope of the signal occurring in the resonance circuit during the resonation periods at the start of the excitation periods.

32. A communication device according to claim 31, characterized by a discontinuity in the slope of the signal occurring in the resonance circuit during the resonation periods at the start of the excitation periods.

33. A communication device according to claim 32, characterized by a DC level shift causing said discontinuity to occur.

34. A communication device according to claim 27, characterized in that the excitation circuit comprises a controllable switching device serially arranged with the resonance circuit between first and second terminals of a voltage supply source and having a control terminal coupled to the input of the power amplifier for periodically supplying an excitation voltage signal to the resonance circuit, phase and/or frequency coupled with the modulated carrier signal circuit.

35. A communication device according to claim 34, characterized in that the controllable switching device comprises a switch resistance serially arranged with the resonance circuit between the first and second terminals of said voltage supply source and being varied from a maximum resistance value to a minimum resistance value and vice versa to smoothen transients of said excitation voltage signal increasing above a threshold voltage within the excitation periods.

36. A communication device according to claim 35, characterized in that the controllable switching device comprises a MOS transistor having its drain source path serially coupled to the resonance circuit being controlled to vary the switch resistance stepwise.

37. A communication device according to claim 34, characterized by amplitude modulation means for modulating the amplitude of the supply voltage between the first and second terminals of the voltage supply source with modulation signal dependent envelope amplitude variations of the modulated high frequency carrier signal.

38. A communication device according to claim 27, characterized by a balanced implementation of the excitation circuit and the resonance circuit.

39. A communication device according to claim 27, characterized in that the resonance circuit comprises a parallel RLC network, an inductor and resistor thereof being part of an antenna device.

40. A communication device according to claim 27, characterized in that the resonance circuit comprises a parallel RLC circuit comprising an inductor provided with a tapped coupling to the antenna impedance.

41. A communication device according to claim 40, characterized in that the inductor is provided with a further tap, coupled to the excitation circuit.

42. A communication device according to claim 27, further including an antenna device having narrow bandwidth.

43. High frequency power amplifier for use in a communication device according to claim 27, characterized by a resonance circuit part provided with antenna coupling means for completing the resonance circuit part to form said resonance circuit by coupling antenna means thereto.

* * * * *